United States Patent [19]

Tai

[11] Patent Number: 5,734,603
[45] Date of Patent: Mar. 31, 1998

[54] METHOD AND CIRCUIT FOR REDUCING CELL PLATE NOISE

[75] Inventor: Jy-Der David Tai, Hsin-Chu, Taiwan

[73] Assignee: Powerchip Semiconductor Corp., Hsin-Chu, Taiwan

[21] Appl. No.: 797,840

[22] Filed: Feb. 10, 1997

[51] Int. Cl.⁶ ..................................... G11C 11/24
[52] U.S. Cl. .............................. 365/149; 365/206
[58] Field of Search .................. 365/149, 206, 365/189.09, 226

[56] References Cited

U.S. PATENT DOCUMENTS

| | | | |
|---|---|---|---|
| 4,259,729 | 3/1981 | Tokushige | 365/149 |
| 4,593,382 | 6/1986 | Fujishima et al. | 365/149 |
| 4,769,784 | 9/1988 | Doluca et al. | 365/149 |
| 5,255,232 | 10/1993 | Foss et al. | 365/226 X |

*Primary Examiner*—Joseph A. Popek
*Attorney, Agent, or Firm*—Ladas & Parry

[57] ABSTRACT

A method and a circuit of reducing cell plate noise induced by memory access are provided. The circuit includes a sample and hold circuit, a differential amplifier and a current source. The sample and hold circuit maintains a sample voltage identical to the normal level of the reference cell plate voltage. The differential amplifier compares the sample voltage with the reference cell plate voltage during memory access in the DRAM and generates a difference voltage corresponding to the cell plate noise. The current source, which is controlled by the difference voltage, can modify the reference cell plate voltage to reduce the cell plate noise during memory access.

17 Claims, 2 Drawing Sheets

5,734,603

METHOD AND CIRCUIT FOR REDUCING CELL PLATE NOISE

BACKGROUND OF THE INVENTION

1. Field of the Invention

The present invention relates in general to semiconductor circuits, and, in particular, to a method and circuit for reducing cell plate noise induced by memory access in the reference cell plate voltage of dynamic random access memory (DRAM) circuits, especially negative noise, which may disturb stored data of unselected memory cells.

2. Description of the Prior Art

A one-transistor DRAM cell design is a very popular cell structure adopted by DRAM designers and manufacturers. The one-transistor DRAM cell includes a capacitor for storing the charge in the cell and a transistor connected with the capacitor providing an access path to the capacitor. The access transistor in each DRAM cell is controlled by a wordline and its source/drain is connected between the capacitor in the same DRAM cell and a bitline. When a wordline is in HIGH logic state or "selects" all the DRAM cells connected to this wordline, data can be read from or written into these DRAM cells through the bitlines connected to these DRAM cells. All these memory cells in a DRAM chip constitute a memory array. In addition, peripheral circuits used for addressing and data manipulation are necessary in any DRAM chip.

FIG. 1 (PRIOR ART) shows an abbreviated memory cell array of DRAMs containing four memory cells. Each transistor-capacitor pair (M1 and C1, M2 and C2, M3 and C3, M4 and C4) constitutes a DRAM memory cell. There are two wordlines (WL1 and WL2) and two bitlines (BL1 and BL2) shown in FIG. 1 for illustration. Wordline WL1 controls the first memory cell (containing transistor M1 and capacitor C1) and the second memory cell (containing transistor M2 and capacitor C20). Wordline WL2 controls the third memory cell (containing transistor M3 and capacitor C3) and the fourth memory cell (containing transistor M4 and capacitor C4). Therefore, if wordline WL1 selects the first and second memory cells or turns on transistors M1 and M2, data can be read from or written into capacitors C1 and C2, respectively, through bitlines BL1 and BL2. Generally, the number of memory cells controlled by any one wordline is specific, for example, 8 for bytes and 16 for words.

In typical DRAM design, cell plates of storage capacitors are kept at a reference cell plate voltage $V_{CP}$, as shown in FIG. 1. Note that another conducting plate of each of these storage capacitors are connected to the access transistor in the same DRAM cell. Generally, this reference cell plate voltage $V_{CP}$ is chosen to be an intermediate value between a low voltage source $V_{SS}$ and a high voltage source $V_{DD}$ in the DRAM chip, for example, to be ½ $V_{DD}$ between 0V and $V_{DD}$. Such a cell plate voltage may reduce voltage drop across the storage capacitors of memory cells, applying less voltage stress on the storage capacitors. A reference cell plate voltage generator is normally designed for this purpose. Since this reference cell plate voltage generator provides voltage between the high voltage source $V_{DD}$ and the low voltage source $V_{SS}$, it consumes static current, which may contribute to the stand-by current of the DRAM chip and waste power. Therefore, the static current provided by the reference cell plate voltage generator is designed to be kept very low to reduce stand-by power of the DRAM chip.

FIG. 2 (PRIOR ART) shows a typical reference cell plate voltage generator for generating the cell plate voltage in the conventional DRAM. Reference cell plate voltage generator 10 includes a biasing circuit composed of transistors M7 to M10 and an output circuit composed of transistors M5 and M6. The biasing circuit including transistors M7 to M10 is designed to provide adequate bias to the output circuit including M5 and M6 such that this reference cell plate voltage generator provides a desired reference cell plate voltage $V_{CP}$. In the circuit shown in FIG. 2, the ratio of the sizes of transistors M7 and M10 is used to determine the right level of the reference cell plate voltage $V_{CP}$ while the ratio of the sizes of transistors M8 and M9 relative to those of transistors M7 and M10 determines the static current of the reference cell plate voltage generator 10 provided by transistors M5 and M6. If this static current is high, generator 10 has low output impedance or high drive ability. On the other hand, generator 10 has high output impedance or low drive ability if the static current is low. As described above, the static current provided by reference cell plate voltage generator 10 must be kept low since it contributes to the stand-by power consumption of the DRAM chip.

However, the low static current characteristic of the conventional reference cell plate voltage generator can create a severe problem during memory access. Referring to FIG. 1 and FIG. 2, during memory access all the memory cells connected to selected wordlines are enabled and may be accessed by corresponding bitlines. That is, the current in the bitlines may charge or discharge the storage capacitors of the selected memory cells when the corresponding access transistors are turned on. Therefore, current surges flowing into and from the storage capacitors can occur in the period of memory write and read cycles. However, as described above, reference cell plate voltage generator 10 having less drive ability can not provide adequate current to these storage capacitors, and, as a result, voltage noise in the reference cell plate voltage $V_{CP}$ occurs.

This induced voltage noise may be negative or positive, in other words, lower or higher than the normal level of the reference cell plate voltage $V_{CP}$. It is known that memory cells that are not being accessed may be disturbed due to high negative noise on their cell plates. For any memory cell not being accessed, the gate of its access transistor is connected to a grounded wordline, and, therefore, the access transistor is turned off. Basically, negative voltage noise on the cell plate can not charge or discharge the storage capacitor as long as the access transistor is kept off. As a result, the voltage on the storage node of the storage capacitor moves down with this negative noise for the same amount. Usually, the access transistors in DRAMs are of NMOS type. If a low voltage or zero voltage is stored in the memory cell not being accessed and the magnitude of the negative noise is greater than the threshold voltage $V_T$ of its access transistor, the access transistor will turn on and introduce current from the connected bitline to flow through the storage capacitor. Thus this memory cell is disturbed by this negative noise. The sub-threshold current of the access transistor also increases even though the negative noise is not so strong.

Two conventional techniques may be used to reduce disturbance effects caused by negative cell plate voltage noise. The first technique is to implement access transistors having a high threshold voltage $V_T$ to increase noise margin. However, high $V_T$ access transistors will slow down memory access. The alternative is to apply a negative voltage to the unselected wordlines to reverse-bias these access transistors, but that requires extra control of each wordline decoder and driver and takes up more area and power.

SUMMARY OF THE INVENTION

Therefore, an object of the present invention is to provide a method and circuit for reducing cell plate noise induced by memory access, especially negative noise, to prevent a disturbance of the memory cells not being accessed without the loss of the access speed and without the need for extra control circuitry.

Another object of the present invention is to provide a method and circuit for reducing cell plate noise that can maintain the stability of the reference cell plate voltage and reduce the voltage noise induced by memory access, rather than merely preventing disturbance of the memory cells not being accessed.

Another object of the present invention is to provide a circuit for reducing cell plate noise that does not introduce static current and consumes less power.

The present invention achieves the above-indicated objectives by providing a method to reduce cell plate noise induced by memory access. First, when there is no memory access, the reference cell plate voltage is sampled and kept as a sample voltage, the value of which is identical to the normal level of the cell plate voltage. Thus, the sample voltage is compared with the noisy cell plate voltage during memory access and a difference voltage corresponding to the cell plate noise is generated. This difference voltage is used to decide whether cell plate noise is present or not, and is preferably amplified to improve the sensitivity. Thus, the reference cell plate voltage is modified in response to the difference voltage to reduce the cell plate noise during memory access. A useful method for modifying the cell plate voltage is to apply a current source on the cell plate in order to enforce the drivability of the reference cell plate voltage generator.

In addition, the present invention also provides a circuit for reducing cell plate noise in accordance with the above-indicated method. This circuit includes a sample and hold circuit, a comparison circuit, an amplifier and a current source. The sample and hold circuit maintains a sample voltage identical to the normal level of the reference cell plate voltage. The comparison circuit compares the sample voltage with the reference cell plate voltage during memory access in the DRAM and generates a difference voltage corresponding to the cell plate noise. The amplifier then magnifies the difference voltage to improve the sensitivity. The current source, which is controlled by the difference voltage, can modify the reference cell plate voltage to reduce the cell plate noise during memory access.

Various other objects, advantages and features of the present invention will become readily apparent from the detailed description, claims, and accompanying drawings.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The embodiment set forth herein illustrates a method of reducing negative cell plate noise in a DRAM and a circuit using the method. In a DRAM cell, negative cell plate noise tends to turn on the unselected access transistor and causes a disturbance of the stored electric charge. This negative noise on the cell plate can be reduced if a circuit is introduced to provide a strong current in response to variations of the reference cell plate voltage. That is, when noise is detected, a large current is provided. To prevent the additional circuit from consuming extra power, the circuit only provides temporary current during memory access and is dynamically controlled such that it introduces no static current to the DRAM when there is no memory access. However, it will be understood by those skilled in the art that the principles of reducing negative cell plate noise shown in this embodiment are also readily applicable to positive cell plate noise.

The method of reducing cell plate noise induced by memory access is described as follows. When there is no memory access, the reference cell plate voltage is a normal level, for example, $\frac{1}{2}V_{DD}$. Since there is no current flowing into or from any memory cell, the cell plate voltage is stable and has no noise. Therefore, this normal level is first sampled and kept as a sample voltage, which is used as a comparison reference value. When any read or write action happens in the DRAM, this sample voltage is compared with the noisy cell plate voltage and a difference voltage corresponding to the cell plate noise is generated. This difference voltage is used to decide whether cell plate noise is present or not. In addition, the difference voltage may represent three situations, that is, positive noise, negative noise and noise-free on the reference cell plate voltage $V_{CP}$. Thus, the reference cell plate voltage $V_{CP}$ is modified in response to the difference voltage representing the situation of negative noise to reduce the cell plate noise during memory access. It is noted that the difference may preferably be amplified to improve the sensitivity of the step of modifying $V_{CP}$. During the process, the memory access condition is essential and could be indicated by an enable signal $V_{EN}$ of the DRAM.

Figure 1:
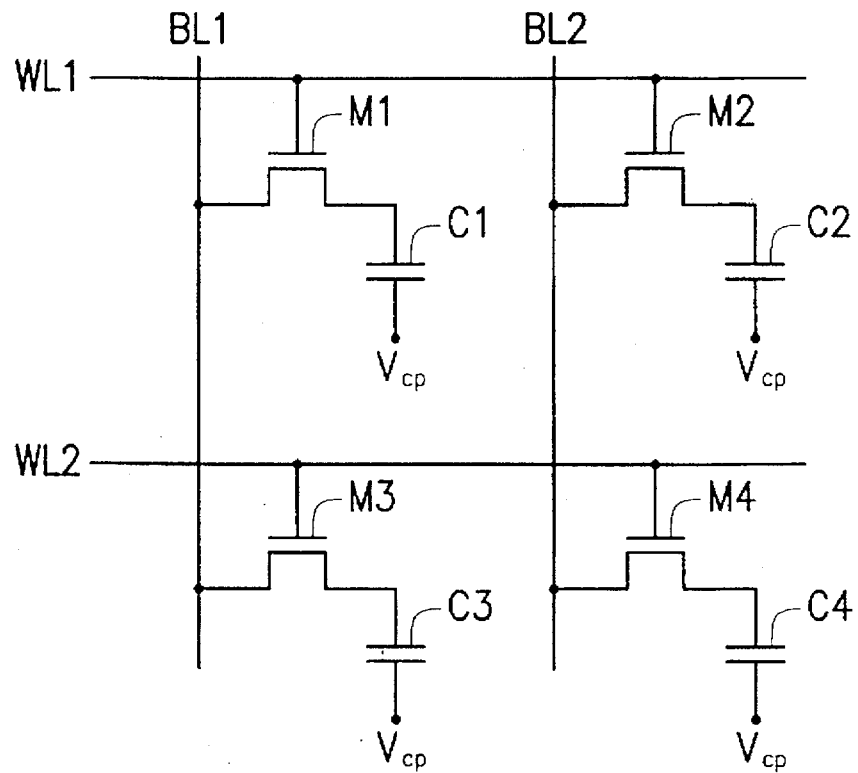
FIG. 1 (PRIOR ART) shows a DRAM memory cell array containing four memory cells.
Figure 2:
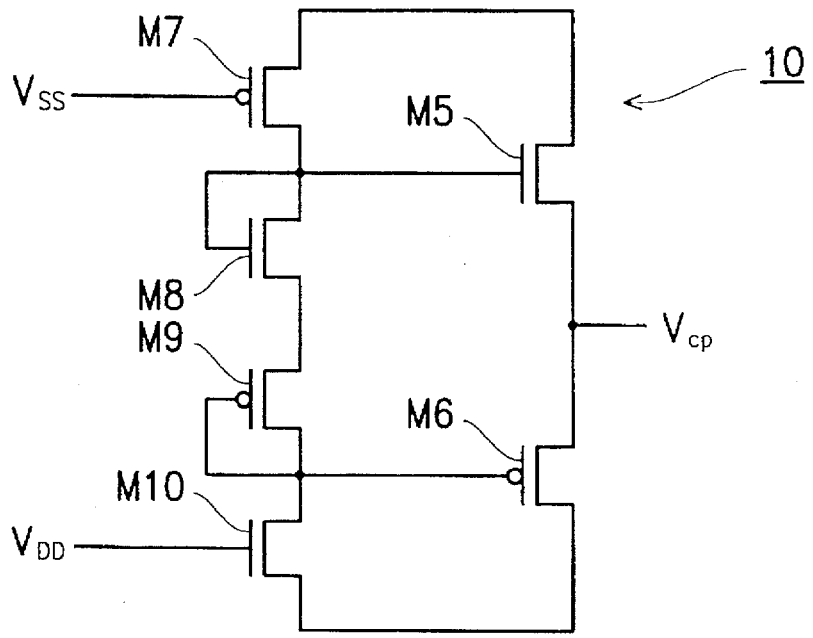
FIG. 2 (PRIOR ART) shows an example of a reference cell plate voltage generator for generating the cell plate voltage in the conventional DRAM.
Figure 3:
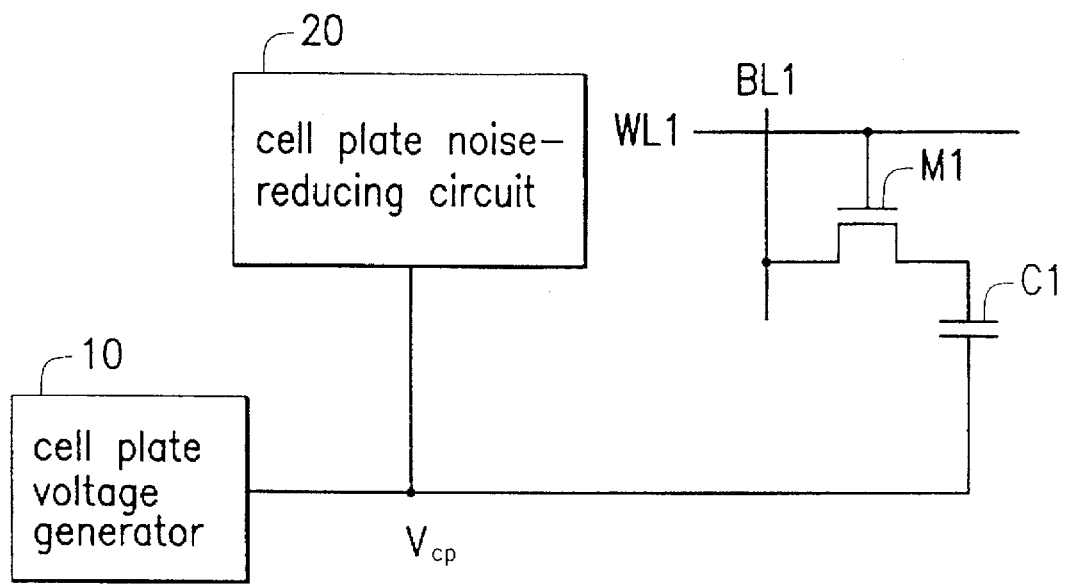
FIG. 3 schematically illustrates in block diagram form the inter-relationship of the conventional cell plate voltage generator and the cell plate noise-reducing circuit in accordance with the embodiment of the present invention.

An example of the circuit for reducing negative cell plate noise in accordance with the above method is described in detail as follows. FIG. 3 illustrates in block diagram form the inter-relationship between conventional cell plate voltage generator 10 and cell plate noise-reducing circuit 20. Cell plate noise-reducing circuit 20 is connected to conventional cell plate voltage generator 10 in parallel at the cell plate of storage capacitor C1. Cell plate noise-reducing circuit 20 can retrieve the noise-free and noisy reference cell plate voltages and provide current to the cell plate of capacitor C1. In FIG. 3, only one memory cell is illustrated. However, it will be understood by those skilled in the art that the reference cell plate voltage $V_{CP}$ provided by cell plate voltage generator 10 and the cell plate noise-reducing circuit can be applied to each memory cell in the subject DRAM.

Figure 4:
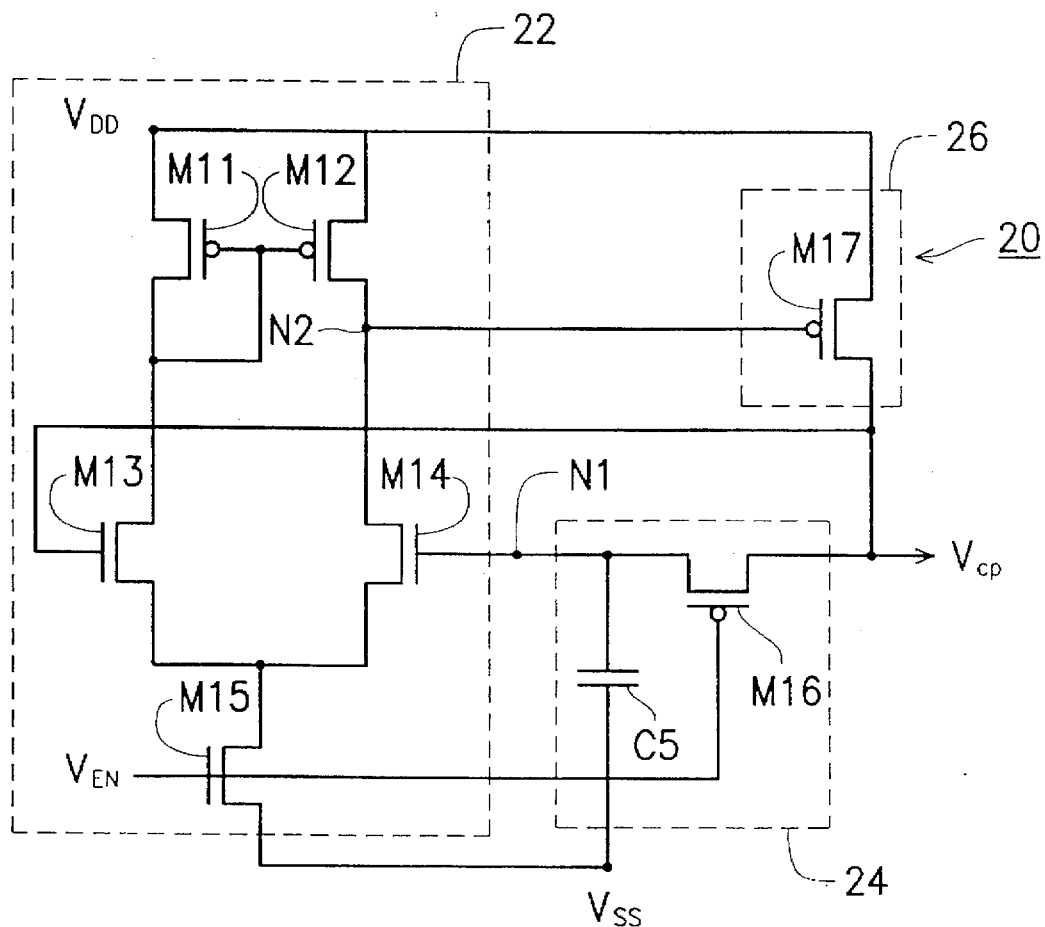
FIG. 4 shows a cell plate noise-reducing circuit in accordance with the preferred embodiment of the present invention.

FIG. 4 shows an example circuit diagram of cell plate noise-reducing circuit 20. Cell plate noise-reducing circuit 20 includes sample/hold circuit 24, differential amplifier 22 and controlled current source 26. Sample/hold circuit 24 maintains a sample voltage at node N1, which is identical to the reference cell plate voltage $V_{CP}$ when there is no memory access in the DRAM. Differential amplifier 22 is a controllable device. It receives the sample voltage at node N1 and the noisy cell plate voltage $V_{CP}$ and generates a difference voltage at node N2 corresponding to the cell plate noise. The difference voltage at node N2 controls current source 26. When the difference voltage at node N2 represents the situation of negative noise on the cell plate voltage, current source 26 provides a temporarily large current to the cell plate voltage $V_{CP}$.

In this embodiment, sample/hold circuit 24 includes capacitor C5 and PMOS switch M16. PMOS switch M16 is connected between capacitor C5 and the reference cell plate voltage $V_{CP}$ and is controlled by enable signal $V_{EN}$. Differential amplifier 22 includes transistors M11~M15, wherein transistors M11 and M12 provide current mirror loads to differential pair transistors M13 and M14. Transistor M15 is a controlled transistor that enables or disables differential amplifier 22. Transistor M15 is a large-scale transistor that is connected to $V_{DD}$, providing a large current to $V_{CP}$.

Cell plate noise occurs when there is a memory access. Therefore, the cell plate noise is predictable. The enable signal $V_{EN}$ is in LOW logic state if there is no memory access. On the other hand, enable signal $V_{EN}$ is in HIGH logic state during memory access. When enable signal $V_{EN}$ is in LOW logic state, differential amplifier 22 is disabled and will not contribute static current in the DRAM. However, enable signal $V_{EN}$ turns on transistor M16, allowing the sample voltage at node N1 to be identical to the cell plate voltage $V_{CP}$. When there is a memory access, the enable signal $V_{EN}$ then switches to the HIGH logic state, enabling differential amplifier 22 while disabling transistor M16. As a result, the normal level of the cell plate voltage $V_{CP}$ is held at node N1. When cell plate noise on $V_{CP}$ starts to happen due to memory access, the noisy cell plate voltage $V_{CP}$ is compared with the sample voltage at node N1. A negative noise in the cell plate voltage $V_{CP}$ is amplified in contrast to the sample voltage at node N1. The amplified negative signal at node N2 is applied to the gate of transistor M17. As a result, transistor M17 is turned on to provide a large current to the cell plates of the storage capacitors for pulling up the voltage at this node. In other words, transistor M17 provides a negative feedback path for differential amplifier 22. The noise level at the reference cell plate voltage $V_{CP}$ is thereby suppressed.

The method and circuit for reducing cell plate noise induced by memory access in accordance with present invention has advantages over the prior art. Cell plate noise induced by memory access, especially negative noise, is effectively reduced to prevent disturbance of the memory cells without the loss of access speed and the need for extra control circuitry. In addition, the noise-reducing method and circuit can maintain the stability of the reference cell plate voltage and reduce the cell plate noise induced by memory access. Furthermore, the additional circuit in accordance with the present invention does not introduce static current, and, therefore, consumes less power.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. A method of reducing cell plate noise induced by memory access in a reference cell plate voltage of a DRAM, comprising:

maintaining a sample voltage identical to the reference cell plate voltage when there is no memory access;

comparing the sample voltage with the reference cell plate voltage during memory access to generate a difference voltage corresponding to cell plate noise; and modifying the reference cell plate voltage in response to the difference voltage to reduce the cell plate noise during memory access.

2. The method of reducing cell plate noise as recited in claim 1, further comprising a step of amplifying the difference voltage to improve the sensitivity of the step of modifying the reference cell plate voltage.

3. The method of reducing cell plate noise as recited in claim 1, wherein the memory access condition is indicated by an enable signal of the DRAM.

4. The method of reducing cell plate noise as recited in claim 1, wherein the cell plate noise during memory access is negative and the reference cell plate voltage during memory access is modified and pulled up by providing a current source.

5. The method of reducing cell plate noise as recited in claim 4, further comprising a step of amplifying the difference voltage to improve the sensitivity of the step of modifying the reference cell plate voltage.

6. The method of reducing cell plate noise as recited in claim 4, wherein the memory access condition is indicated by an enable signal of the DRAM.

7. A circuit for reducing cell plate noise induced by memory access in a reference cell plate voltage of a DRAM, comprising:

a sample and hold circuit for maintaining a sample voltage identical to the reference cell plate voltage when there is no memory access in the DRAM;

a comparison circuit for comparing the sample voltage with the reference cell plate voltage during memory access in the DRAM and generating a difference voltage corresponding to the cell plate noise; and a current source, controlled by the difference voltage, for modifying the reference cell plate voltage to reduce the cell plate noise during memory access.

8. The circuit for reducing cell plate noise as recited in claim 7, wherein the cell plate noise during memory access is negative.

9. The circuit for reducing cell plate noise as recited in claim 8, wherein the sample and hold circuit comprises:

a switch device, controlled by an enable signal indicating the memory access condition of the DRAM, for sampling the sample voltage from the reference cell plate voltage when there is no memory access; and a capacitor for holding the sample voltage when the switch device is turned off.

10. The circuit for reducing cell plate noise as recited in claim 8, further comprising an amplifier for magnifying the difference voltage generated by the comparison circuit.

11. The circuit for reducing cell plate noise as recited in claim 10, wherein the comparison circuit and the amplifier are implemented by a differential amplifier, input terminals of which are supplied by the sample voltage and the reference cell plate voltage and one of output terminals of which serves as the difference voltage.

12. The circuit for reducing cell plate noise as recited in claim 11, wherein the differential amplifier is controlled by an enable signal indicating the memory access condition of the DRAM and the differential amplifier is activated during memory access.

13. The circuit for reducing cell plate noise as recited in claim 8, wherein the current source is a MOS device for pulling up the reference cell plate voltage, a gate of which is connected to the difference voltage, and a drain and source of which are connected between a high voltage supply of the DRAM and the reference cell plate voltage.

14. A circuit for reducing negative cell plate noise induced by memory access in a reference cell plate voltage of a DRAM, comprising:

a sample and hold circuit, having a capacitor and a switch connected between the capacitor and the reference cell plate voltage, for generating a sample voltage identical to the reference cell plate voltage when there is no memory access in the DRAM;

a differential amplifier for comparing the sample voltage with the reference cell plate voltage during memory access in the DRAM and generating a difference voltage corresponding to the negative cell plate noise; and a current source, controlled by the difference voltage, for providing current to the reference cell plate voltage to reduce the cell plate noise during memory access.

15. The circuit for reducing cell plate noise as recited in claim 14, wherein the differential amplifier is controlled by an enable signal indicating the memory access condition of the DRAM and the differential amplifier is activated during memory access.

16. The circuit for reducing cell plate noise as recited in claim 14, wherein the switch of the sample and hold circuit is a MOS device.

17. The circuit for reducing cell plate noise as recited in claim 14, wherein the current source is a MOS device.

* * * * *

UNITED STATES PATENT AND TRADEMARK OFFICE
Certificate

Patent No. 5,734,603                                                        Patented: March 31, 1998

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Jy-Der David Tai and Cheng-Hsiung Kuo.

Signed and Sealed this Tenth Day of August, 1999.

BRIAN W. BROWN
*Special Program Examiner*
Technology Center 2800
Semiconductors, Electrical
and Optical Systems